United States Patent
Kim et al.

(10) Patent No.: US 12,237,043 B2
(45) Date of Patent: Feb. 25, 2025

(54) APPARATUS AND METHOD FOR ZQ CALIBRATION

(71) Applicant: SAMSUNG ELECTRONICS CO., LTD., Suwon-si (KR)

(72) Inventors: Yongseob Kim, Suwon-si (KR); Taehyung Kim, Suwon-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 245 days.

(21) Appl. No.: 17/984,757

(22) Filed: Nov. 10, 2022

(65) Prior Publication Data
US 2023/0142493 A1 May 11, 2023

(30) Foreign Application Priority Data
Nov. 10, 2021 (KR) .................. 10-2021-0154274
Apr. 18, 2022 (KR) .................. 10-2022-0047624

(51) Int. Cl.
*G11C 7/10* (2006.01)
*G06F 13/16* (2006.01)
*H03K 19/00* (2006.01)

(52) U.S. Cl.
CPC ........ *G11C 7/1048* (2013.01); *G06F 13/1668* (2013.01); *H03K 19/0005* (2013.01); *G11C 2207/2254* (2013.01)

(58) Field of Classification Search
CPC .......... G11C 7/1048; G11C 2207/2254; G11C 29/50008; G11C 7/1057; G11C 7/1084; G11C 29/022; G11C 29/028; G11C 29/78; G06F 13/1668; H03K 19/0005; H03K 19/017545

USPC ...................................... 365/189.18
See application file for complete search history.

(56) References Cited

U.S. PATENT DOCUMENTS

| | | | |
|---|---|---|---|
| 7,400,165 B2 | 7/2008 | Park | |
| 7,969,182 B2 | 6/2011 | Kim et al. | |
| 9,543,952 B2 | 1/2017 | Lee | |
| 10,396,787 B2 | 8/2019 | Johnson | |
| 10,693,460 B1* | 6/2020 | Takahashi | G11C 11/4093 |
| 2018/0033470 A1* | 2/2018 | Lee | H03K 19/0005 |
| 2019/0052268 A1* | 2/2019 | Lee | G11C 29/028 |
| 2021/0111706 A1 | 4/2021 | Satoh et al. | |
| 2021/0134334 A1 | 5/2021 | Pilollo et al. | |

(Continued)

FOREIGN PATENT DOCUMENTS

| | | | | |
|---|---|---|---|---|
| CN | 109390011 A | * | 2/2019 | G11C 11/4063 |
| EP | 3822797 A2 | | 5/2021 | |

OTHER PUBLICATIONS

CN 109390011 A (Year: 2019).*

*Primary Examiner* — Fernando Hidalgo
(74) *Attorney, Agent, or Firm* — Sughrue Mion, PLLC

(57) ABSTRACT

There are provided an apparatus and method for performing impedance control (ZQ) calibration without a ZQ pin and an external resistor. The apparatus includes an output driver circuit connected to a signal pin interfacing with an external device; a register control word (RCW) configured to store an output driver impedance parameter related to a pull-up output voltage (VOH) condition of the signal pin; and a ZQ calibration circuit connected to the signal pin and configured to perform calibration using a VOH target level of the signal pin and control a termination resistance of the signal pin.

20 Claims, 13 Drawing Sheets

(56) References Cited

U.S. PATENT DOCUMENTS

| | | |
|---|---|---|
| 2021/0151084 A1 | 5/2021 | Kim |
| 2021/0184677 A1 | 6/2021 | Cho et al. |
| 2022/0310137 A1* | 9/2022 | Song ................... G11C 29/028 |
| 2024/0014817 A1* | 1/2024 | Lee ..................... G11C 7/1084 |
| 2024/0111695 A1* | 4/2024 | Jeong .................. G11C 29/022 |
| 2024/0223160 A1* | 7/2024 | Gans .................... G11C 29/16 |
| 2024/0371457 A1* | 11/2024 | Kim ..................... G11C 16/26 |

* cited by examiner

| Function | OPERATION CODE | Data |
|---|---|---|
| Soc ODT (Controller ODT Value for VOH calibration) | OP[2:0] | $000_B$: Disable (default)<br>$001_B$: RZQ/1<br>$010_B$: RZQ/2<br>$011_B$: RZQ/3<br>$100_B$: RZQ/4<br>$101_B$: RZQ/5<br>$110_B$: RZQ/6<br>$111_B$: RFU |

FIG. 8

| Function | Operand | Data | |
|---|---|---|---|
| DQ ODT<br>(DQ Bus Receiver ODT) | OP[2:0] | $000_B$: Disable (default)<br>$001_B$: RZQ/1<br>$010_B$: RZQ/2<br>$011_B$: RZQ/3<br>$100_B$: RZQ/4<br>$101_B$: RZQ/5<br>$110_B$: RZQ/6<br>$111_B$: RFU | — 734 |
| CA ODT<br>(CA Bus Receiver ODT) | OP[6:4] | $000_B$: Disable (default)<br>$001_B$: RZQ/1<br>$010_B$: RZQ/2<br>$011_B$: RZQ/3<br>$100_B$: RZQ/4<br>$101_B$: RZQ/5<br>$110_B$: RZQ/6<br>$111_B$: RFU | — 733 |

APPARATUS AND METHOD FOR ZQ CALIBRATION

CROSS-REFERENCE TO RELATED APPLICATIONS

This application is based on and claims priority under 35 U.S.C. § 119 to Korean Patent Application Nos. 10-2021-0154274, filed on Nov. 10, 2021 and 10-2022-0047624, filed on Apr. 18, 2022, in the Korean Intellectual Property Office, the disclosures of which are incorporated by reference herein in their entireties.

BACKGROUND

Embodiments relate to a semiconductor device, and more particularly, to an apparatus and method for performing impedance control (ZQ) calibration without a ZQ pin and an external resistor.

Electronic devices include a plurality of semiconductor integrated circuits (or semiconductor chips) and have a complicated hardware configuration. According to the demand for miniaturization and weight reduction of electronic devices, it is necessary to decrease the number of elements mounted in electronic devices. A swing width of each signal is reduced for minimizing a transfer time of each of the signals transmitted between semiconductor chips. As a swing width of each signal is reduced, an influence of external noise on semiconductor chips increases, and signal reflection caused by an impedance mismatch is severe in an interface. In order to solve the impedance mismatch, semiconductor chips include a ZQ pin and perform ZQ calibration using an external resistor connected to the ZQ pin. As high-capacity memory is needed, the system may include a multi-memory channel including a plurality of memory devices and a memory controller that controls each of the memory channels to operate independently. The memory controller may provide clocks, commands, addresses and data to the memory device. The command may control the memory device to perform various memory operations, for example, a read operation to retrieve data from the memory device and a write operation to store data in the memory device. Data associated with the command may be provided between the memory controller and the memory device at known timings with respect to reception and/or transmission by the memory device. The memory controller performs the ZQ calibration operation on a signal line that transmits a command, an address, and data provided to the memory device. However, when the ZQ calibration operation is performed by having a ZQ pin for each single memory channel on the memory controller having a multi-memory channel interface and mounting an external resistor connected to the ZQ pin, the hardware configuration of the memory controller becomes more complicated.

SUMMARY

Embodiments provide an apparatus and method for performing impedance control (ZQ) calibration without a ZQ pin and an external resistor.

According to some embodiments, there is provided a device including an output driver circuit connected to a signal pin, the output driver circuit interfacing with an external device via the signal pin; a register control word (RCW) configured to store an output driver impedance parameter related to a pull-up output voltage (VOH) condition of the signal pin; and a ZQ calibration circuit connected to the signal pin and configured to perform calibration using a VOH target level of the signal pin and control a termination resistance of the signal pin.

According to another aspect of some embodiments, there is provided an apparatus including a memory device; and a memory controller configured to control the memory device, wherein the memory controller includes a first output driver circuit connected to a first signal pin, the output driver circuit interfacing with the memory device via the first signal pin; an RCW configured to store an output driver impedance parameter related to a VOH condition of the first signal pin; and a first ZQ calibration circuit connected to the first signal pin and configured to perform calibration using a VOH target level of the first signal pin and control a termination resistance of the first signal pin.

Also provided is a method of calibrating ZQ between a first device and a second device interfacing with the first device. The method includes storing, performed by the first device, an output driver impedance parameter in a RCW, the output driver impedance parameter being related to a VOH condition of a first signal pin connected to the second device; and performing, by the first device, ZQ calibration using a VOH target level of the first signal pin, wherein a termination resistance of the first signal pin is controlled.

BRIEF DESCRIPTION OF THE DRAWINGS

Embodiments will be more clearly understood from the following detailed description taken in conjunction with the accompanying drawings in which:

FIG. 3 is a diagram for describing a system-on-chip (SoC) on-die termination (ODT) function stored in a register control word in FIG. 2;

FIG. 8 is a diagram for describing a command and address (CA) ODT function and a DQ ODT function in FIG. 7;

DETAILED DESCRIPTION OF THE EMBODIMENTS

Figure 1:
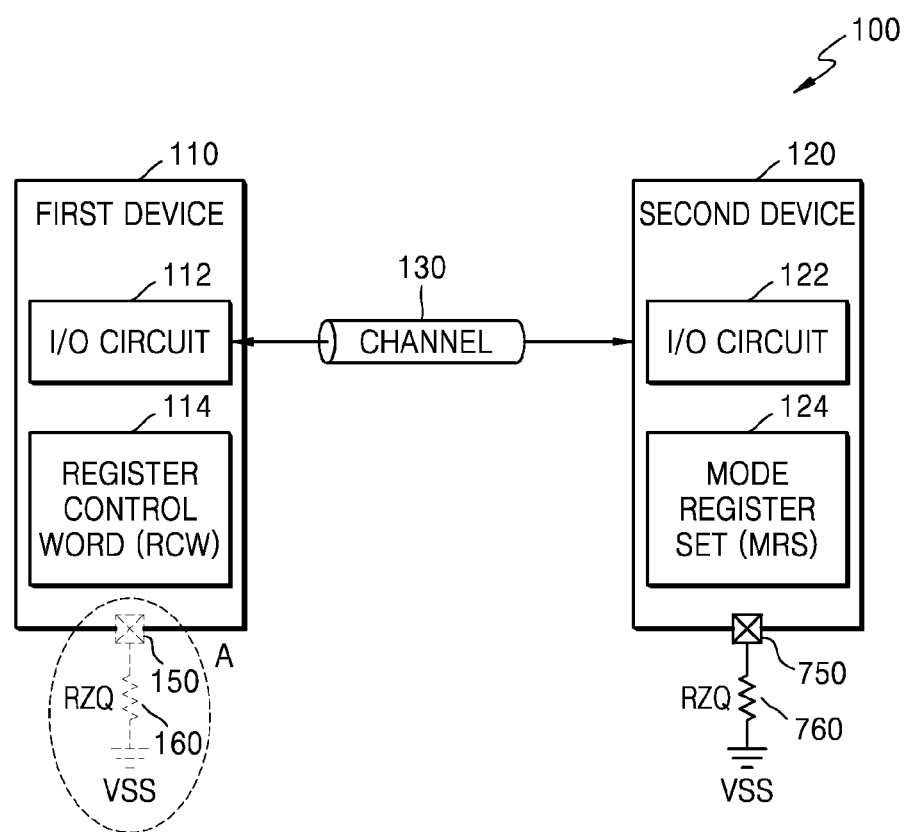
FIG. 1 is a block diagram of an apparatus according to an embodiment.

FIG. 1 is a block diagram of an apparatus 100 according to an embodiment.

Referring to FIG. 1, the apparatus 100 may include a first device 110 and a second device 120. The apparatus 100 may be included in a personal computer (PC) or mobile electronic equipment. The mobile electronic equipment may include a laptop computer, a cellular phone, a smartphone, a tablet PC, a personal digital assistant (PDA), an enterprise digital assistant (EDA), a digital still camera, a digital video camera, a portable multimedia player (PMP), a personal navigation device or a portable navigation device (PND), a handheld game console, a mobile Internet device (MID), a wearable computer, an Internet of things (IoT) device, an Internet of everything (IoE) device, or a drone.

The first device 110 may include an integrated circuit (IC), a system-on-chip (SoC), an application processor (AP), a mobile AP, a chipset, or a group of chips. For example, the first device 110 may correspond to a memory device performing a memory control function and may be included in an AP. The AP may include a memory controller, random access memory (RAM), a central processing unit (CPU), a graphics processing unit (GPU), and/or a modem.

The second device 120 may correspond to a memory device. The memory device may include dynamic RAM (DRAM) or static RAM (SRAM) but is not limited thereto. For example, the second device 120 may correspond to double data rate Synchronous DRAM (DDR SDRAM), low power DDR (LPDDR) SDRAM, graphic DDR (GDDR) SDRAM, or Rambus DRAM (RDRAM). Alternatively, the second device 120 may include high bandwidth memory (HBM) or processor-in-memory (PIM).

According to an embodiment, the second device 120 may include a non-volatile memory device. For example, the second device 120 may include resistive-type memory, such as phase-change RAM (PRAM), magnetic RAM (MRAM), or resistive RAM (RRAM). Hereinafter, for convenience of description, the first device 110 is referred to as a memory controller 110, and the second device 120 is referred to as a memory device 120. Although the memory device 120 is illustrated as a single semiconductor chip, there may be "n" memory devices actually (where "n" is a non-zero whole number).

The memory controller 110 may communicate with the memory device 120 through a channel 130. The channel 130 may include a signal line, which physically or electrically connects the memory controller 110 to the memory device 120. The opposite ends of the channel 130 may be respectively connected to a pin of the memory controller 110 and a pin of the memory device 120. The term "pin" broadly refers to electrical interconnection with respect to an IC and includes, for example, a pad or another electrical contact point in an IC. For simplicity of the drawings, it is illustrated that signals are transmitted between the memory controller 110 and the memory device 120 through a single signal line, but the channel 130 may actually include a clock signal line, a command/address bus, and a data bus.

The memory controller 110 may provide a command to the memory device 120 to perform a memory operation. Non-limiting examples of a memory command may include timing commands for controlling the timing of various operations, access commands for accessing memory, e.g., a read command for performing a read operation and a write command for performing a write operation, and mode register write and read commands for performing mode register write and read operations.

During an operation, when a read command and a related address are provided by the memory controller 110 to the memory device 120, the memory device 120 may receive the read command and the related address and output read data from a memory location corresponding to the related address by performing a read operation. The read data may be provided by the memory device 120 to the memory controller 110, according to timing related to the reception of the read command. For example, when the read data is provided by the memory device 120 to the memory controller 110, the timing may be based on a read latency (RL) value indicating the number of clock cycles after the read command. The RL value may be set by the memory controller 110 in the memory device 120. For example, the RL value may be programmed in a mode register set (MRS) 124 of the memory device 120. As is known, information for settings of various operation modes and/or selection of characteristics for memory operation may be programmed in the MRS 124 of the memory device 120. One of these settings may relate to the RL value.

During an operation, when a write command and a related address are provided by the memory controller 110 to the memory device 120, the memory device 120 may receive the write command and the related address and write write data from the memory controller 110 to a memory location corresponding to the related address by performing a write operation. The write data may be provided by the memory device 120 to the memory controller 110, according to timing related to the reception of the write command. For example, when the write data is provided by the memory controller 110 to the memory device 120, the timing may be based on a write latency (WL) value indicating the number of clock cycles after the write command. The WL value may be programmed by the memory controller 110 in the MRS 124 of the memory device 120.

To accurately perform memory operations according to operation timings, the memory controller 110 may perform memory training on the memory device 120. The memory training may include a memory core parameter training on a memory core and/or a peripheral circuit parameter training on peripheral circuits excluding the memory core. As the subject of training, the memory controller 110 may determine optimal parameters for memory core parameters and/or peripheral circuit parameters. According to an embodiment, the memory device 120 may be the subject of training and perform memory training.

The memory controller 110 may include an input/output (I/O) circuit 112 and a register control word (RCW) 114, which initializes the memory device 120 and/or controls the memory device 120 according to the characteristics of an operation. The RCW 114 may include various algorithms, which configure the memory controller 110 such that the memory controller 110 may normally interoperate with the memory device 120. For example, code indicating the frequency, timing, driving, and detailed operation parameters of the memory device 120 and the like may be set in the RCW 114. The code of the RCW 114 may indicate a burst length, RL/WL, an SoC on-die termination (ODT) function, and pull-down/ODT and pull-up/output high level voltage (Voh) calibration.

The burst length may be provided to set the maximum number of accessible column locations for a read and/or write command. The RL/WL may be provided to define a clock cycle delay between a read and/or write command and the first bit of valid output and/or input data. The SoC ODT may be provided to satisfy pull-up output voltage (VOH) specification (or codition) between the memory controller 110 and the memory device 120. The pull-down/ODT and pull-up/Voh calibration may be provided to improve signal integrity by adjusting the swing range and/or drive strength of signals, which are transmitted through the clock signal line, command/address bus, and/or data bus of the channel 130.

The memory controller 110 may issue a mode register write command and program the MRS 124 of the memory device 120. The MRS 124 may be programmed to set a plurality of operation parameters, options, various functions, characteristics, and modes of the memory device 120. The MRS 124 may be programmed with parameter code configured in the same manner as the code of the RCW 114. In other words, the MRS 124 may be programmed according to the code of the RCW 114. After the apparatus 100 is powered up, the memory controller 110 may set the RCW 114 for controlling the memory device 120 to match the initialization and/or operation characteristics of the memory device 120. During the initialization of the memory device 120, the memory controller 110 and the memory device 120 may perform ZQ calibration on signal lines of the channel 130. The memory controller 110 may perform the ZQ calibration without a ZQ pin 150 and an external resistor 160 and the memory device 120 may perform the ZQ calibration using a ZQ pin 750 and an external resistor 760.

The I/O circuit 112 of the memory controller 110 may transmit a clock signal, a command signal, an address signal, and/or data to the memory device 120 through the channel 130. The I/O circuit 112 may receive read data, through the channel 130, from the memory device 120 that has performed a read operation. The memory controller 110 may perform ZQ calibration on a signal line, which transmits the clock signal, the command signal, the address signal, and/or the data. At this time, the memory controller 110 may perform the ZQ calibration without a ZQ pin 150 and an external resistor 160, which are marked in region A. The ZQ calibration of the memory controller 110 will be described in detail with reference to FIGS. 2 to 6 below.

The memory controller 110 may further include a memory physical layer (PHY) connected to the channel 130. The memory PHY may include a logic layer and a physical or electrical layer for signals, frequency, timing, driving, detailed operation parameters, and functionality, which are required for efficient communication between the memory controller 110 and the memory device 120. The memory PHY may support features of a DDR and/or an LPDDR protocol defined by the Joint Electron Device Engineering Council (JEDEC).

The memory device 120 may include an I/O circuit 122 and the MRS 124. When a mode register write command is issued by the memory controller 110, the MRS 124 may store parameter code, which is constituted of appropriate bit values provided to the command/address bus of the channel 130. The MRS 124 may store the same burst length, RL/WL, SoC ODT function, and pull-down/ODT and pull-up/Voh calibration as those of the code of the RCW 114.

When the memory device 120 includes DRAM, the MRS 124 may be used to control delay-locked loop (DLL) reset, DLL enable/disable, output drive strength, additive latency, termination data strobe (TDQS) enable/disable, I/O buffer enable/disable, column address strobe (CAS) write latency, dynamic termination, write cyclic redundancy check (CRC), multi-purpose register (MPR) location function, MPR operation function, gear down mode, MPR read format, power down mode, reference voltage (Vref) monitoring, read preamble training mode, read preamble function, write preamble function, CA parity function, CRC error status, CA parity error status, ODT function, data mask function, write data bus inversion (DBI) function, read DBI function, error detection code (EDC) hold pattern, and the like, which are related to DRAM.

The I/O circuit 122 of the memory device 120 may receive a clock signal, a command signal, an address signal, and/or data transmitted from the memory controller 110 through the channel 130. The I/O circuit 122 may transmit read data from a memory core to the memory controller 110 through the channel 130. The memory device 120 may perform ZQ calibration on the signal line that transmits the read data. At this time, the memory device 120 may perform the ZQ calibration using a ZQ pin 750 and an external resistor 760. The ZQ calibration of the memory device 120 will be described in detail with reference to FIGS. 7 to 11 below.

Figure 2:
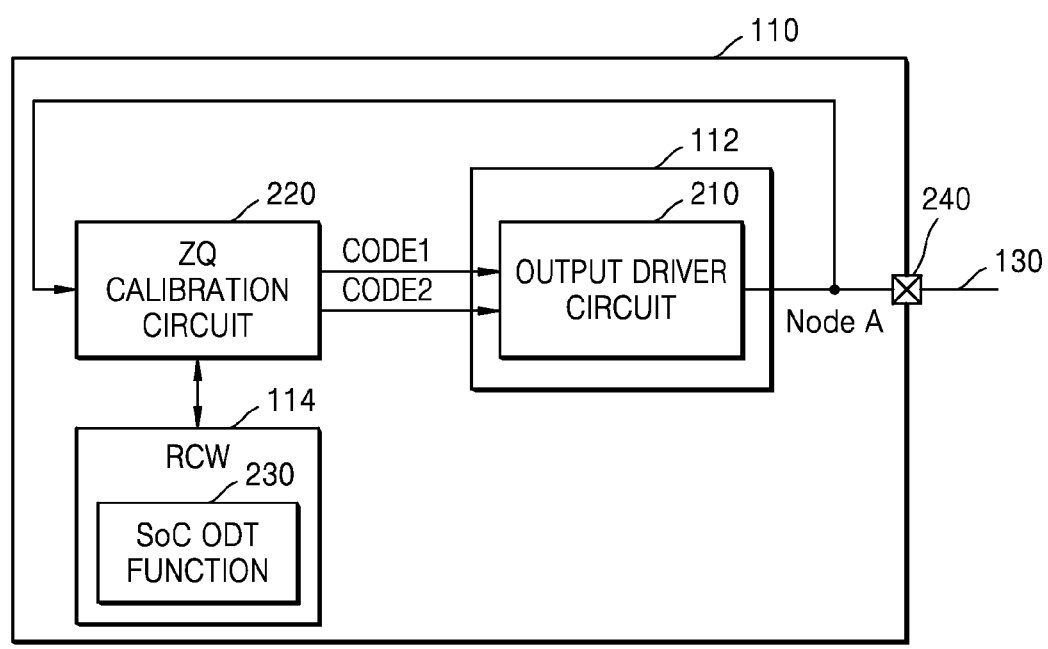
FIG. 2 is a block diagram of a memory controller according to embodiments.
Figure 4:
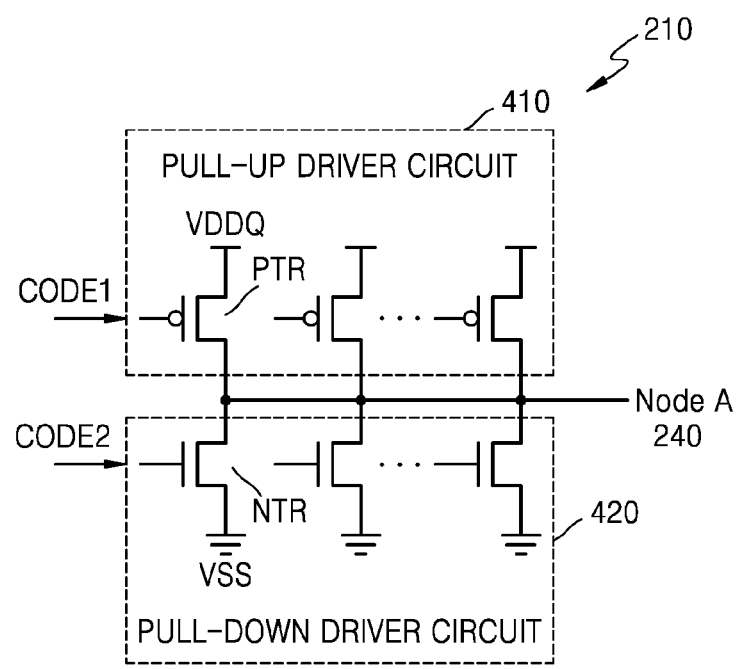
FIG. 4 is a circuit diagram of an output driver circuit in FIG. 2.

FIG. 2 is a block diagram of the memory controller 110 according to embodiments. FIG. 3 is a diagram for describing an SoC ODT function 230 stored in the RCW 114 in FIG. 2. FIG. 4 is a circuit diagram of an output driver circuit 210 in FIG. 2.

Referring to FIGS. 1 and 2, the memory controller 110 may include the RCW 114, a ZQ calibration circuit 220, and the I/O circuit 112. Although not shown, the memory controller 110 may further include a memory channel controller, a command queue, and an address generator, a refresh logic circuit, an arbiter, an error correction code (ECC) check block, an ECC generation block, and the like.

Code indicating the frequency, timing, driving, and detailed operation parameters of the memory device 120 may be set in the RCW 114. For example, the RCW 114 may include the SoC ODT function 230 of FIG. 3. Referring to FIG. 3, the SoC ODT function 230 may include operation code OP[2:0], which illustrates output driver impedance control to satisfy the VOH specification between the memory controller 110 and the memory device 120. When the bits of the operation code OP[2:0] are set to "000", output driver impedance is disabled (default). When the bits of the operation code OP[2:0] are set to "001", RZQ/1 is preselected as output driver impedance. For example, RZQ may be set to 240Ω. When the bits of the operation code OP[2:0] are set to "010", RZQ/2 is preselected as output driver impedance. When the bits of the operation code OP[2:0] are set to "011", RZQ/3 is preselected as output driver impedance. When the bits of the operation code OP[2:0] are set to "100", RZQ/4 is preselected as output driver impedance. When the bits of the operation code OP[2:0] are set to "101", RZQ/5 is preselected as output driver impedance. When the bits of the operation code OP[2:0] are set to "110", RZQ/6 is preselected as output driver impedance. The bits "111" of the operation code OP[2:0] are reserved future usage (RFU). For convenience of description, output driver impedance may interchangeably be used with a termination resistance value.

A high-speed I/O interface between the memory controller 110 and the memory device 120 may use a signal having an amplitude or a swing range, which is about half of the amplitude or swing range of a power supply voltage VDDQ. A signal from the memory controller 110 to the memory device 120 may be designed to have a VOH of about 0.5*VDDQ, and a signal from the memory device 120 to the memory controller 110 may be designed to be calibrated to 0.5*VDDQ. For example, VDDQ may be about 0.3 V to about 0.5 V, and VOH may be calibrated to about 250 mV. To satisfy such signaling, the SoC ODT code of the RCW 114 needs to be equally set in the MRS 124.

For example, according to the SoC ODT code "100", the output driver impedance of the memory device 120 may be preset to 240/4=60Ω. During a read operation of the memory device 120, a transmitter (e.g., an output driver circuit 710 in FIG. 7) of the memory device 120 may transmit data DQ, which has a VOH target level of 250 mV, to the memory controller 110. At this time, to receive the data DQ having a VOH target level of 250 mV, a receiver of the memory controller 110 needs to be terminated to an ODT resistance value of 60Ω that is the same as the output driver impedance of the memory device 120.

Here, the receiver ODT of the memory controller 110 and the transmitter ODT of the memory device 120 is the same as an equivalent resistance, and accordingly, the VOH specification is satisfied. In this case, the memory controller 110 and the memory device 120 may be supported with the VOH specification through the data line of the channel 130. Similarly, when the transmitter ODT of the memory controller 110 and the receiver ODT of the memory device 120 is the same as an equivalent resistance, the VOH specification is satisfied. The memory controller 110 and the memory device 120 may be supported with the VOH specification through the clock signal, command signal, address signal, and/or data line of the channel 130. Then, the memory controller 110 may perform ZQ calibration using a target level in accordance with the VOH specification. The memory controller 110 may perform ZQ calibration on an input of the ZQ calibration circuit 220 by using a target level in accordance with the VOH specification of a signal line connected to the memory device 120. In other words, the memory controller 110 may perform ZQ calibration without the ZQ pin 150 and the external resistor 160, which are marked in the region A in FIG. 1.

The ZQ calibration circuit 220 may be connected to a node A on the signal line connected to a signal pin 240. The signal pin 240 may correspond to a clock signal pin, a command signal pin, an address signal pin, or a data pin of the memory controller 110 and may be connected to the channel 130. The node A may be set to have a VOH target level in accordance with the VOH specification. The ZQ calibration circuit 220 may perform calibration using the VOH target level of the node A. The calibration may include pull-up calibration and pull-down calibration. A first code signal CODE1 may be generated by performing the pull-up calibration, and a second code signal CODE2 may be generated by performing the pull-down calibration.

The I/O circuit 112 may include an output driver circuit 210 connected to the signal pin 240. The output driver circuit 210 may provide a termination resistance value of the signal pin 240, based on the first and second code signals CODE1 and CODE2 provided by the ZQ calibration circuit 220. The pull-up and/or pull-down termination resistance value of the signal pin 240 may be controlled by the output driver circuit 210, in response to the first and second code signals CODE1 and CODE2. The output driver circuit 210 may include a pull-up driver circuit 410 and a pull-down driver circuit 420, as shown in FIG. 4.

Referring to FIG. 4, the output driver circuit 210 may include the pull-up driver circuit 410, which is connected between a VDDQ line and the node A, and the pull-down driver circuit 420, which is connected between the node A and a ground voltage line, i.e., a VSS line.

The pull-up driver circuit 410 may include a plurality of P-channel metal-oxide semiconductor (PMOS) transistors PTR, which are connected between the VDDQ line and the node A and arranged in parallel. Each of the PMOS transistors PTR may be turned on or off in response to "n" bits of the first code signal CODE1. According to an embodiment, the PMOS transistors PTR may have the same or different size ratios related to the width of a transistor. A resistance value according to the on or off states of the PMOS transistors PTR by the first code signal CODE1 may be provided as a pull-up termination resistance of the node A, i.e., the signal pin 240.

The pull-down driver circuit 420 may include a plurality of N-channel MOS (NMOS) transistors NTR, which are connected between the node A and the VSS line and arranged in parallel. Each of the NMOS transistors NTR may be turned on or off in response to "n" bits of the second code signal CODE2. According to an embodiment, the NMOS transistors NTR may have the same or different size ratios related to the width of a transistor. A resistance value according to the on or off states of the NMOS transistors NTR may be provided as a pull-down termination resistance of the node A, i.e., the signal pin 240.

Although it is illustrated in FIG. 4 that the pull-up driver circuit 410 includes PMOS transistors and the pull-down driver circuit 420 includes NMOS transistors, embodiments are not limited thereto. For example, each of the pull-up driver circuit 410 and the pull-down driver circuit 420 may include NMOS transistors or PMOS transistors. Alternatively, each of the pull-up driver circuit 410 and the pull-down driver circuit 420 may include both NMOS transistors and PMOS transistors, taking into account the operating characteristics of transistors.

The output driver circuit 210 may transmit a clock signal, a command signal, an address signal, or data through the signal pin 240. A pull-up drive code and a pull-down drive code may be provided to the output driver circuit 210 to output a logic level of the clock signal, the command signal, the address signal, or the data to the signal pin 240. The PMOS transistors PTR of the pull-up driver circuit 410 may be turned on or off in response to the pull-up drive code. The PMOS transistors PTR corresponding to a bit value "0" of the pull-up drive code may be turned on, and the signal pin 240 may be driven to a logic high level. The NMOS transistors NTR of the pull-down driver circuit 420 may be turned on or off in response to the pull-down drive code. The NMOS transistors NTR corresponding to a bit value "1" of the pull-down drive code may be turned on, and the signal pin 240 may be driven to a logic low level.

Figure 5:
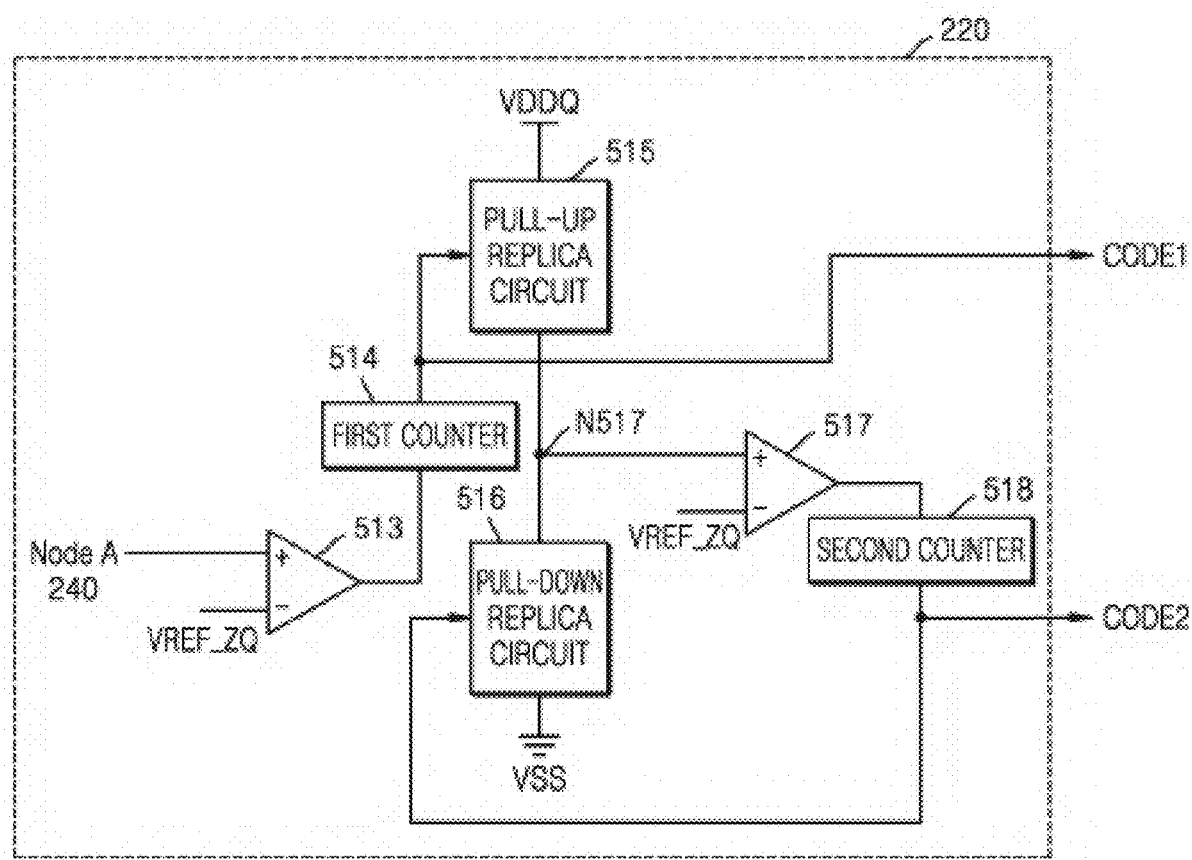
FIG. 5 is a circuit diagram of an impedance control (ZQ) calibration circuit according to an embodiment.

FIG. 5 is a circuit diagram of a ZQ calibration circuit according to an embodiment. FIG. 5 is a circuit diagram of an example of the ZQ calibration circuit 220 in FIG. 2.

Referring to FIG. 5, the ZQ calibration circuit 220 may include a first comparator 513, a first counter 514, a pull-up replica circuit 515, a pull-down replica circuit 516, a second comparator 517, and a second counter 518. The pull-up replica circuit 515 may have substantially the same configuration as the pull-up driver circuit 410 in FIG. 4, and the pull-down replica circuit 516 may have substantially the same configuration as the pull-down driver circuit 420 in FIG. 4. For example, a pull-up replica circuit may have a first configuration, the pull-up driver circuit may have a second configuration, and the first configuration and the second configuration may be the same. Depending on the embodiment, the configurations may be referred to with various identifiers, for example, a third configuration, a fourth configuration, a fifth configuration, a sixth configuration, a seventh configuration, an eighth configuration, a ninth configuration, a tenth configuration, an eleventh configuration, a twelfth configuration, a thirteenth configuration, a fourteenth configuration, a fifteenth configuration and a sixteenth configuration.

The first comparator 513 may compare a voltage level of the node A connected to the signal pin 240 with the level of a reference voltage VREF_ZQ and generate an up/down signal based on a comparison result. The reference voltage VREF_ZQ may be set to a VOH target level in accordance with the VOH specification. For example, the reference voltage VREF_ZQ may have a voltage level corresponding to VDDQ/2, i.e., half of the level of the power supply voltage VDDQ. The first counter 514 may be stepped up or down based on an up/down signal of the first comparator 513 and may thus output a multi-bit count value, i.e., a count code. The count code of the first counter 514 may be provided to the pull-up replica circuit 515. When the pull-up replica circuit 515 is swept by the count code, the voltage level of the node A may increase or decrease.

The first comparator 513 may perform a comparison operation until the result of comparison between the voltage level of the node A and the level of the reference voltage VREF_ZQ is zero or less than a certain value and/or the first counter 514 reaches a dither condition in which the first counter 514 oscillates between step-up and step-down. In this pull-up calibration, when the comparison result is zero or less than the certain value and/or the dither condition is reached, the count code of the first counter 514 may be provided as the first code signal CODE1 of the pull-up replica circuit 515. The pull-up termination resistance of the pull-up replica circuit 515 may be adjusted by the first code signal CODE1.

The pull-up replica circuit 515 may be connected to the pull-down replica circuit 516. The second comparator 517 may compare the level of the reference voltage VREF_ZQ with the voltage level of a connecting node between the pull-up replica circuit 515 and the pull-down replica circuit 516, i.e. N517, and may generate an up/down signal based on a comparison result. The second counter 518 may be stepped up or down based on the up/down signal of the second comparator 517, thereby outputting a count code. The count code of the second counter 518 may be provided to the pull-down replica circuit 516, and the pull-down replica circuit 516 may be swept by the count code of the second counter 518.

The pull-down replica circuit 516 may have substantially the same configuration as the pull-down driver circuit 420 in FIG. 4. The pull-down replica circuit 516 may perform pull-down calibration until the voltage level of the connecting node between the pull-up replica circuit 515 and the pull-down replica circuit 516 becomes equal to the level of the reference voltage VREF_ZQ through the operations of the second comparator 517 and the second counter 518. When the voltage level of the connecting node between the pull-up replica circuit 515 and the pull-down replica circuit 516, i.e. N517, becomes equal to the level of the reference voltage VREF_ZQ, the count code of the second counter 518 may be provided as the second code signal CODE2. The pull-down termination resistance of the pull-down replica circuit 516 may be adjusted by the second code signal CODE2.

The ZQ calibration circuit 220 described above may perform calibration using the VOH target level of the node A connected to the signal pin 240. Accordingly, because the memory controller 110 may perform software ZQ calibration, without hardware components, such as the ZQ pin 150 and the external resistor 160 in FIG. 1, a hardware configuration related to the ZQ calibration circuit 220 may be easy and simple. In addition, because the memory controller 110 does not need the external resistor 160, components and cost may be reduced.

Figure 6:
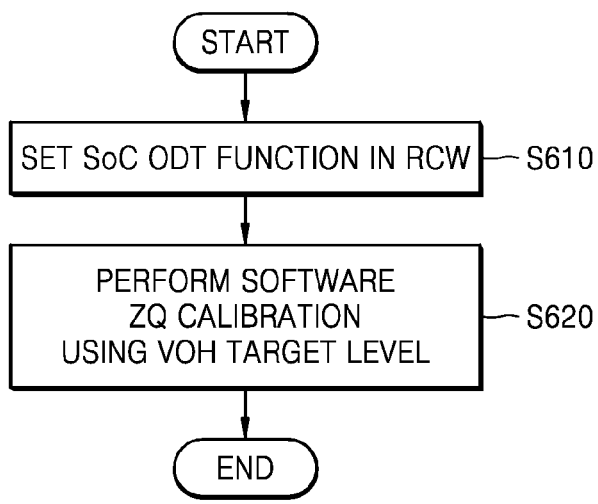
FIG. 6 is a flowchart of a ZQ calibration method according to an embodiment.

FIG. 6 is a flowchart of a ZQ calibration method according to an embodiment. FIG. 6 is a flowchart of a ZQ calibration method of the memory controller 110 of FIG. 2.

Referring to FIG. 6 in connection with FIGS. 1 to 5, the memory controller 110 may set the SoC ODT function 230 in the RCW 114 in operation 5610. As described above with reference to FIG. 3, the SoC ODT code that illustrates output driver impedance control may be equally set in the RCW 114 of the memory controller 110 and the MRS 124 of the memory device 120. Accordingly, the receiver ODT of the memory controller 110 and the transmitter ODT of the memory device 120 will be the same as an equivalent resistance, and the transmitter ODT of the memory controller 110 and the receiver ODT of the memory device 120 will be the same as an equivalent resistance. The memory controller 110 and the memory device 120 may be supported with the VOH specification through the clock signal, command signal, address signal, and/or data line of the channel 130.

The memory controller 110 may perform software ZQ calibration using a VOH target level in accordance with the VOH specification in operation 5620. The memory controller 110 may calibrate ZQ by using a VOH target level of the signal pin 240 connected to the clock signal, command signal, address signal, and/or data line of the channel 130. The ZQ calibration circuit 220 may perform pull-up calibration and pull-down calibration using a VOH target level of a signal line connected to the signal pin 240. A pull-up termination resistance value of the output driver circuit 210 may be controlled in response to the first code signal CODE1 generated by the pull-up calibration, and a pull-down termination resistance value of the output driver circuit 210 may be controlled in response to the second code signal CODE2 generated by the pull-down calibration.

Figure 7:
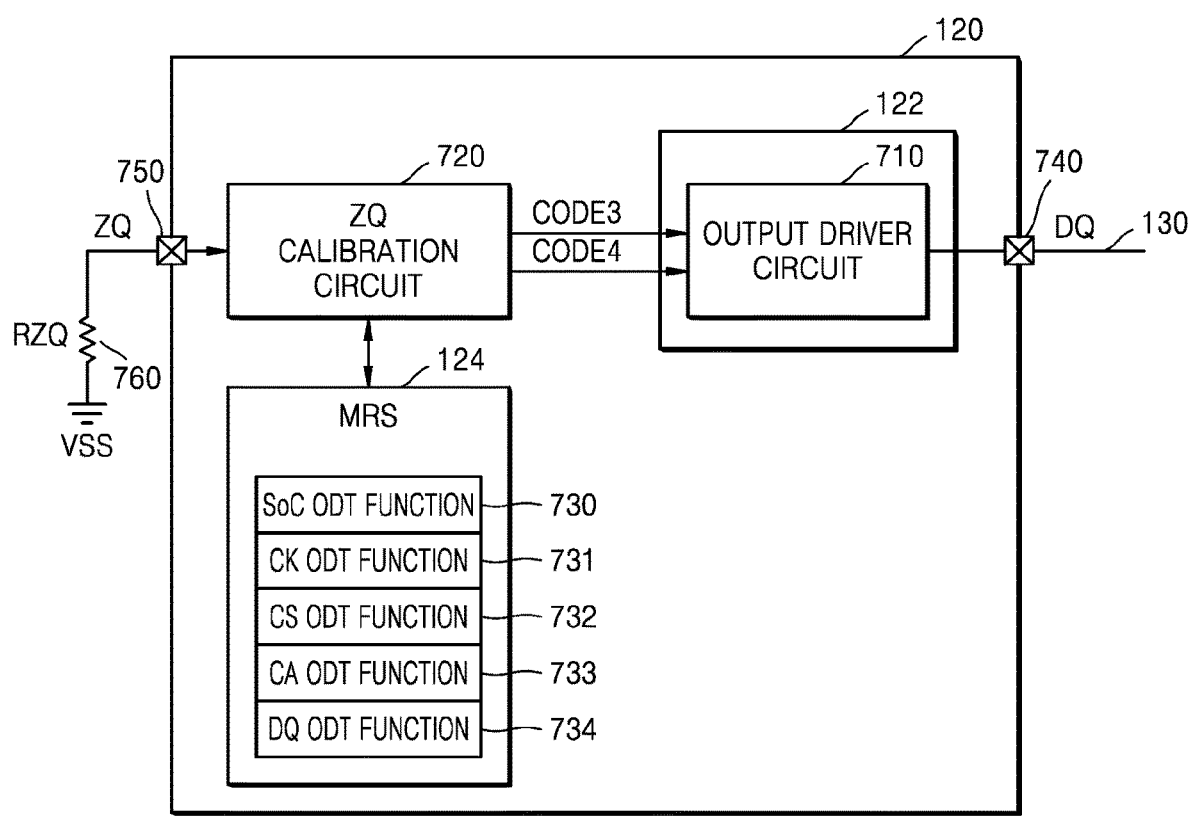
FIG. 7 is a block diagram of a memory device according to embodiments.
Figure 9:
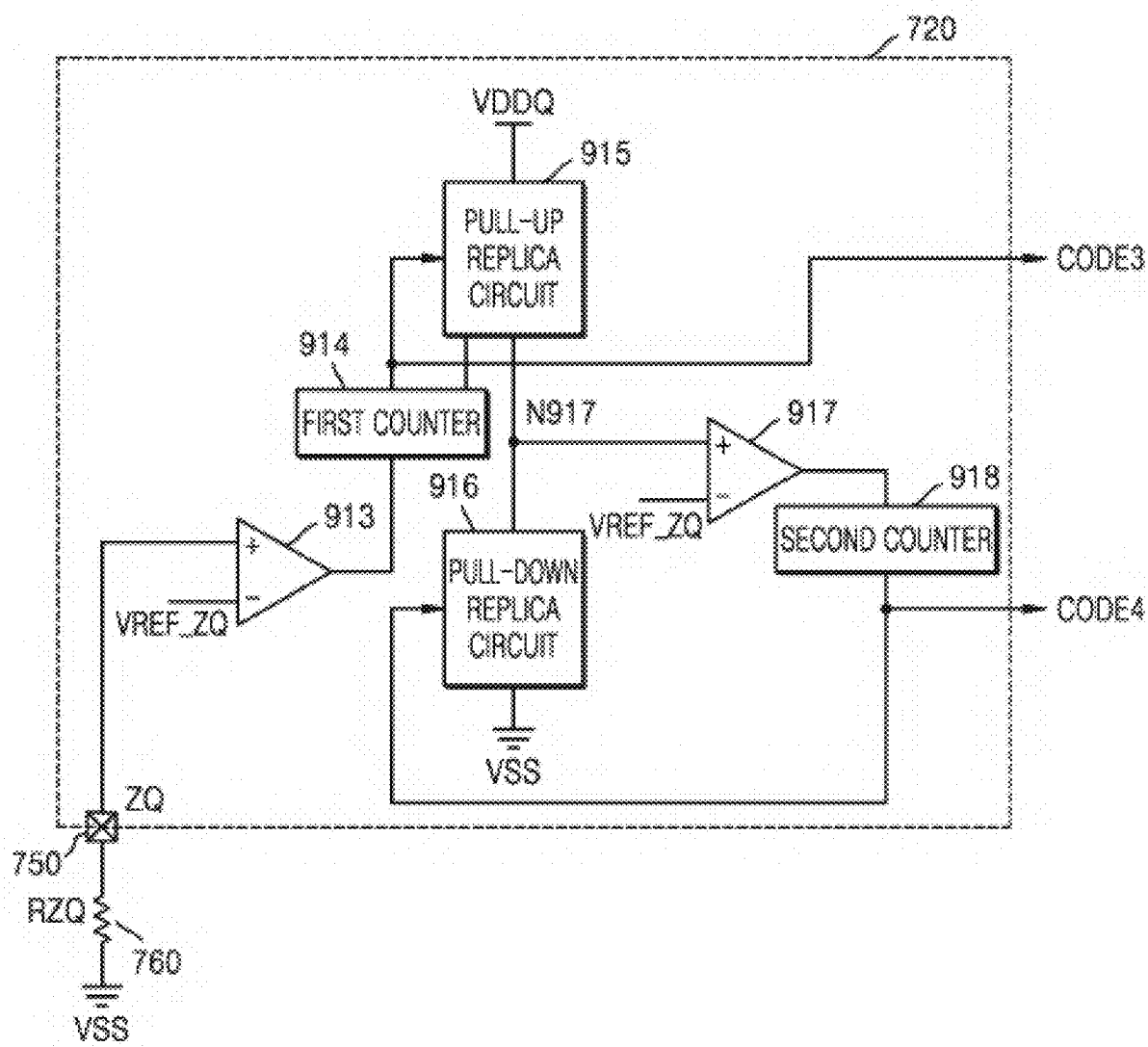
FIG. 9 is a circuit diagram of a ZQ calibration circuit in FIG. 7.
Figure 10:
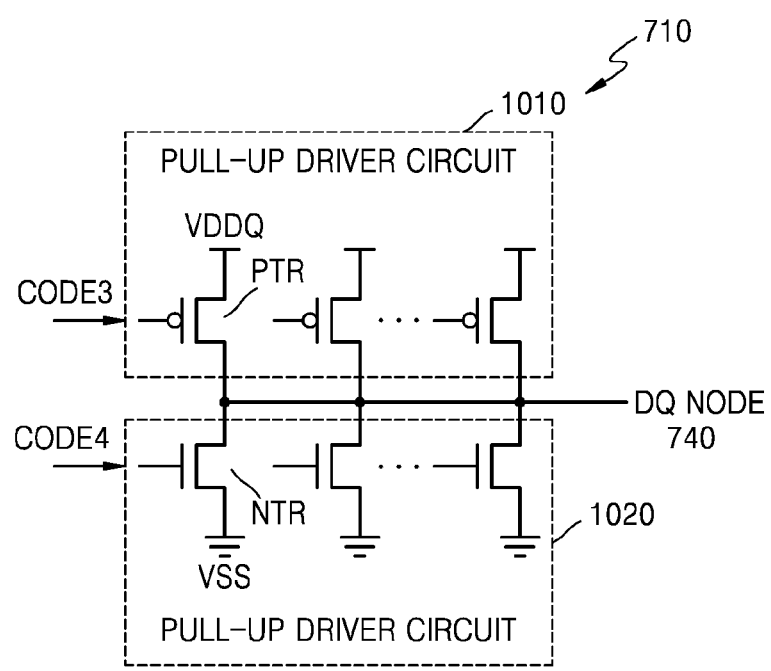
FIG. 10 is a circuit diagram of an output driver circuit in FIG. 7.

FIG. 7 is a block diagram of the memory device 120 according to embodiments. FIG. 8 is a diagram for describing a CA ODT function 733 and a DQ ODT function 734 in FIG. 7. FIG. 9 is a circuit diagram of a ZQ calibration circuit 720 in FIG. 7. FIG. 10 is a circuit diagram of an output driver circuit 710 in FIG. 7.

Referring to FIGS. 1 and 7, the memory device 120 may include the MRS 124, the ZQ calibration circuit 720, and the I/O circuit 122. Although not shown, the memory device 120 may further include a memory cell array, a row decoder, a word line driver, a column decoder, a read/write circuit, a clock circuit, a control logic circuit, an address buffer, and the like.

The MRS 124 may be programmed with information for settings of various operation modes of the memory device 120 and/or selection of characteristics for the memory operations of the memory device 120. For example, the MRS 124 may include an SoC ODT function 730, a CK ODT function 731, a chip select (CS) ODT function 732, the CA ODT function 733, and the DQ ODT function 734. The SoC ODT function 730 may include the operation code OP[2:0], which illustrates output driver impedance control to satisfy the VOH specification between the memory controller 110 and the memory device 120, as described above with reference to FIG. 3. According to the SoC ODT code value in FIG. 3, the output driver impedance of the memory device 120 may be preset. At this time, the receiver of the memory controller 110 may have been terminated to the same ODT resistance value as the output driver impedance of the memory device 120.

The CK ODT function 731 set in the MRS 124 may perform an ODT enable or disable operation of a clock signal receiver. When the memory device 120 has a multi-rank configuration, the CS ODT function 732 may perform an ODT enable or disable operation of a CS signal receiver to secure suitable operation for the multi-rank configuration. The CA ODT function 733 may perform an ODT enable or disable operation of a CA bus receiver. The DQ ODT function 734 may perform an ODT enable or disable operation of a data bus receiver, i.e., a DQ bus receiver. The CA ODT function 733 and the DQ ODT function 734 may be provided to set an ODT value of the CA bus receiver and an ODT value of the DQ bus receiver.

Referring to FIG. 8, the CA ODT function 733 includes an operation code OP[6:4] that illustrates ODT control of the CA bus receiver, and the DQ ODT function 734 includes an operation code OP[2:0] that illustrates ODT control of the DQ bus receiver. When the bits of each of the operation code OP[6:4] and the operation code OP[2:0] are "000" in the CA ODT function 733 and the DQ ODT function 734, ODT may be disabled (default). When the bits are "001", the ODT may be set to RZQ/1. When the bits are "010", the ODT may be set to RZQ/2. When the bits are "011", the ODT may be set to RZQ/3. When the bits are "100", the ODT may be set to RZQ/4. When the bits are "101", the ODT may be set to RZQ/5. When the bits are "110", the ODT may be set to RZQ/6. The bits "111" may be RFU. When the DQ ODT function 734 is disabled, drive strength may be controlled by the SoC ODT function 730 such that a DQ bus has a target level in accordance with the VOH specification.

Referring to FIG. 7, the ZQ calibration circuit 720 may perform calibration using the external resistor 760 connected to the ZQ pin 750 and the reference voltage VREF_ZQ. The calibration may include pull-up calibration and pull-down calibration. A third code signal CODE3 may be generated by performing the pull-up calibration, and a fourth code signal CODE4 may be generated by performing the pull-down calibration. The I/O circuit 122 may include the output driver circuit 710 connected to a DQ pin 740. The output driver circuit 710 may provide a termination resistance value of the DQ pin 740, based on the third and fourth code signals CODE3 and CODE4 provided by the ZQ calibration circuit 720. Although it is described below that the output driver circuit 710 outputs data DQ to the DQ bus of the channel 130, embodiments are not limited thereto. For example, the DQ pin 740 may receive the data DQ through the DQ bus, and accordingly, the output driver circuit 710 connected to the DQ pin 740 may correspond to an element of the I/O circuit 122, and the output driver circuit 710 may be described as the I/O circuit 122.

Figure 13:
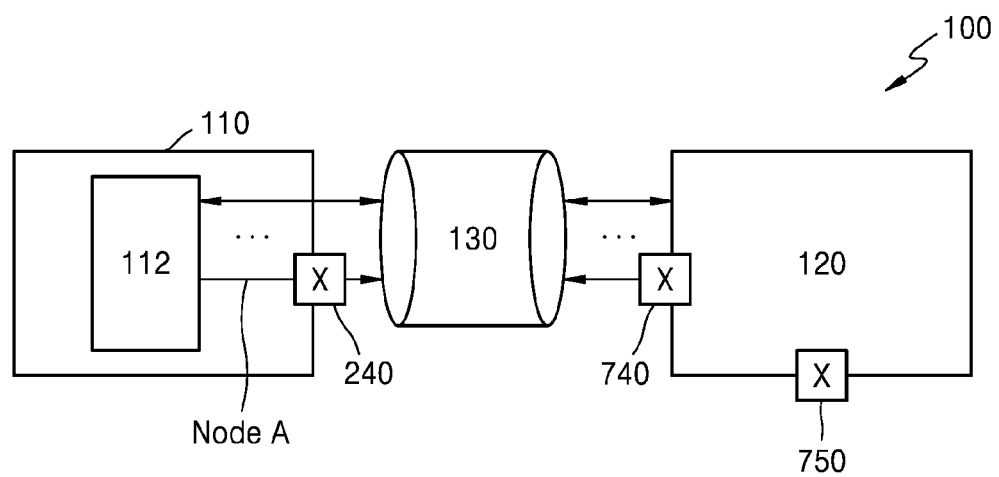
FIG. 13 is another block diagram of an apparatus according to an embodiment.

Also, see FIG. 13 illustrating pin 240, Node A, channel 130, pin 740 and pin 750, according to an embodiment. Channel 130 has been described above with respect to FIG. 1. Node A and pin 240 have been described above with respect to FIG. 2. Pin 740 and pin 750 have been described above with respect to FIG. 7.

Referring to FIG. 9, the ZQ calibration circuit 720 may include a first comparator 913, a first counter 914, a pull-up replica circuit 915, a pull-down replica circuit 916, a second comparator 917, and a second counter 918. The pull-up replica circuit 915 may have substantially the same configuration as a pull-up driver circuit 1010 in FIG. 10, and the pull-down replica circuit 916 may have substantially the same configuration as a pull-down driver circuit 1020 in FIG. 10.

The first comparator 913 may compare a voltage level of a ZQ node connected to the ZQ pin 750 with the level of the reference voltage VREF_ZQ and generate an up/down signal based on a comparison result. The reference voltage VREF_ZQ may be set to a voltage level making the pull-up replica circuit 915 have a target impedance. For example, the reference voltage VREF_ZQ may have a voltage level corresponding to VDDQ/2, i.e., half of the level of the power supply voltage VDDQ. The first counter 914 may be stepped up or down based on an up/down signal of the first comparator 913 and may thus output a multi-bit count value, i.e., a count code. The count code of the first counter 914 may be provided to the pull-up replica circuit 915. When the pull-up replica circuit 915 is swept by the count code, the voltage level of the ZQ node may increase or decrease.

The first comparator 913 may perform a comparison operation until the result of comparison between the voltage level of the ZQ node and the level of the reference voltage VREF_ZQ is zero or less than a certain value and/or the first counter 914 reaches a dither condition in which the first counter 914 oscillates between step-up and step-down. In this pull-up calibration, when the comparison result is zero or less than the certain value and/or the dither condition is reached, the count code of the first counter 914 may be provided as the third code signal CODE3 of the pull-up replica circuit 915. The pull-up termination resistance of the pull-up replica circuit 915 may be adjusted by the third code signal CODE3.

The pull-up replica circuit 915 may be connected to the pull-down replica circuit 916. The second comparator 917 may compare the level of the reference voltage VREF_ZQ with the voltage level of a connecting node between the pull-up replica circuit 915 and the pull-down replica circuit 916, i.e. N917, and may generate an up/down signal based on a comparison result. The second counter 918 may be stepped up or down based on the up/down signal of the second comparator 917, thereby outputting a count code. The count code of the second counter 918 may be provided to the pull-down replica circuit 916, and the pull-down replica circuit 916 may be swept by the count code of the second counter 918.

The pull-down replica circuit 916 may have substantially the same configuration as the pull-down driver circuit 1020 in FIG. 10. The pull-down replica circuit 916 may perform pull-down calibration until the voltage level of the connecting node between the pull-up replica circuit 915 and the pull-down replica circuit 916, i.e. N917, becomes equal to the level of the reference voltage VREF_ZQ through the operations of the second comparator 917 and the second counter 918. When the voltage level of the connecting node between the pull-up replica circuit 915 and the pull-down replica circuit 916 becomes equal to the level of the reference voltage VREF_ZQ, the count code of the second counter 918 may be provided as the fourth code signal CODE4. The pull-down termination resistance of the pull-down replica circuit 916 may be adjusted by the fourth code signal CODE4.

The ZQ calibration circuit 720 may provide the third and fourth code signals CODE3 and CODE4 to the output driver circuit 710 of FIG. 10 and control the pull-up and/or pull-down termination control value of the DQ pin 740.

Referring to FIG. 10, the output driver circuit 710 may include the pull-up driver circuit 1010, which is connected between the VDDQ line and a DQ node connected to the DQ pin 740, and the pull-down driver circuit 1020, which is connected between the DQ node and the VSS line.

The pull-up driver circuit 1010 may include a plurality of PMOS transistors PTR, which are connected between the VDDQ line and the DQ node and arranged in parallel. Each of the PMOS transistors PTR may be turned on or off in response to "n" bits of the third code signal CODE3. According to an embodiment, the PMOS transistors PTR may have the same or different size ratios related to the width of a transistor. A resistance value according to the on or off states of the PMOS transistors PTR by the third code signal CODE3 may be provided as a pull-up termination resistance of the DQ node, i.e., the DQ pin 740.

The pull-down driver circuit 1020 may include a plurality of NMOS transistors NTR, which are connected between the DQ node and the VSS line and arranged in parallel. Each of the NMOS transistors NTR may be turned on or off in response to "n" bits of the fourth code signal CODE4. According to an embodiment, the NMOS transistors NTR may have the same or different size ratios related to the width of a transistor. A resistance value according to the on or off states of the NMOS transistors NTR may be provided as a pull-down termination resistance of the DQ node, i.e., the DQ pin 740.

Although it is illustrated in FIG. 10 that the pull-up driver circuit 1010 includes PMOS transistors and the pull-down driver circuit 1020 includes NMOS transistors, embodiments are not limited thereto. For example, each of the pull-up driver circuit 1010 and the pull-down driver circuit 1020 may include NMOS transistors or PMOS transistors. Alternatively, each of the pull-up driver circuit 1010 and the pull-down driver circuit 1020 may include both NMOS transistors and PMOS transistors, taking into account the operating characteristics of transistors.

Figure 11:
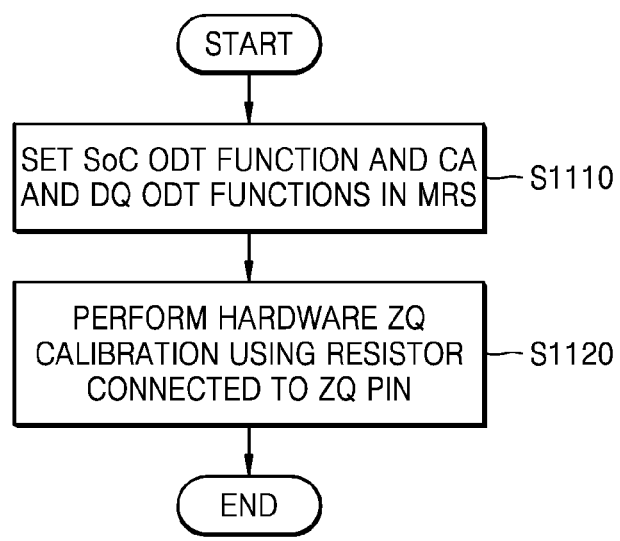
FIG. 11 is a flowchart of a ZQ calibration method of a memory device, according to an embodiment.

FIG. 11 is a flowchart of a ZQ calibration method of a memory device, according to an embodiment.

Referring to FIG. 11 in connection with FIGS. 1 and 7 to 10, the memory device 120 may set the SoC ODT function 730, the CA ODT function 733, and the DQ ODT function 734 in the MRS 124 in operation S1110. As described above with reference to FIG. 3, the SoC ODT code (of the SoC ODT function 230 or 730) that illustrates output driver impedance control may be equally set in the RCW 114 of the memory controller 110 and the MRS 124 of the memory device 120. Accordingly, the receiver ODT of the memory controller 110 and the transmitter ODT of the memory device 120 will be the same as an equivalent resistance, and the transmitter ODT of the memory controller 110 and the receiver ODT of the memory device 120 will be the same as an equivalent resistance. The memory controller 110 and the memory device 120 may be supported with the VOH specification through the clock signal, command signal, address signal, and/or data line of the channel 130.

The memory device 120 may perform hardware ZQ calibration using the external resistor 760 connected to the ZQ pin 750 in operation 51120. The ZQ calibration circuit 720 may perform pull-up calibration and pull-down calibration using the reference voltage VREF_ZQ and the external resistor 760 connected to the ZQ pin 750. The pull-up termination resistance value of the output driver circuit 710 may be controlled in response to the third code signal CODE3 generated by the pull-up calibration, and the pull-down termination resistance value of the output driver circuit 710 may be controlled in response to the fourth code signal CODE4 generated by the pull-down calibration.

Figure 12:
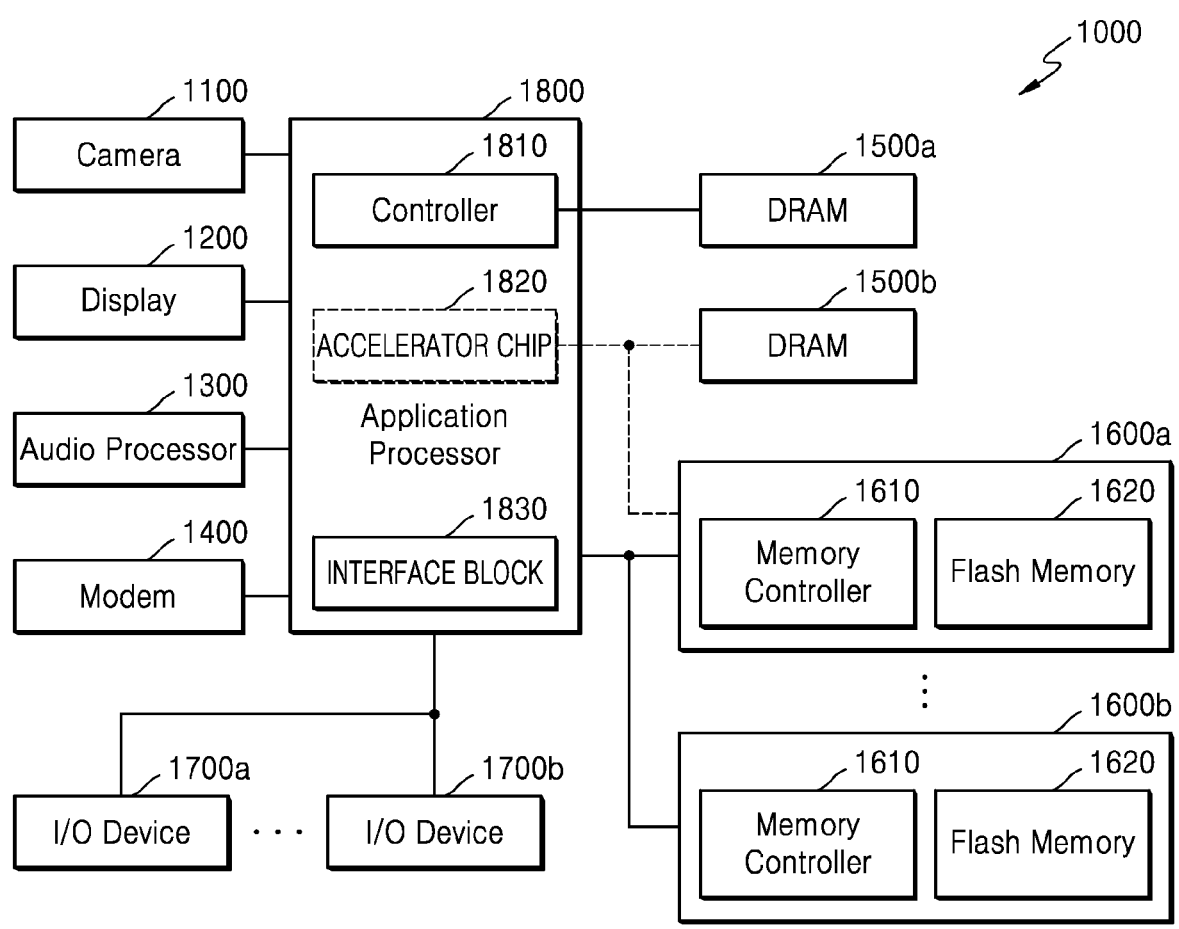
FIG. 12 is a block diagram of a system using a ZQ calibration method, according to embodiments.

FIG. 12 is a block diagram of a system 1000 using a ZQ calibration method, according to embodiments.

Referring to FIG. 12, the system 1000 may include a camera 1100, a display 1200, an audio processor 1300, a modem 1400, DRAMs 1500a and 1500b, flash memory devices 1600a and 1600b, I/O devices 1700a and 1700b, and an AP 1800. The system 1000 may be implemented as a laptop computer, a mobile phone, a smartphone, a table PC, a wearable device, a healthcare device, or an IoT device. The system 1000 may be implemented as a server or a PC.

The camera 1100 may shoot a still image or a video under a user's control and store image/video data or transmit the image/video data to the display 1200. The audio processor 1300 may process audio data included in the contents of the flash memory devices 1600a and 1600b or a network. For wired/wireless data communication, the modem 1400 may modulate a signal, transmit a modulated signal, and demodulate a received signal to restore an original signal. The I/O devices 1700a and 1700b may include devices, such as a universal serial bus (USB) storage, a digital camera, a secure digital (SD) card, a digital versatile disc (DVD), a network adapter, and a touch screen, which provide digital input and/or output functions.

The AP 1800 may generally control operations of the system 1000. The AP 1800 may include a controller 1810, an accelerator chip 1820, and an interface 1830. The AP 1800 may control the display 1200 to display some of the contents stored in the flash memory devices 1600a and 1600b. When the AP 1800 receives user input through the I/O devices 1700a and 1700b, the AP 1800 may perform a control operation corresponding to the user input. The AP 1800 may also include an accelerator block, which is a dedicated circuit for artificial intelligence (AI) data operations, or the accelerator chip 1820 may be provided separately from the AP 1800. The DRAM 1500b may be additionally mounted on the accelerator block or the accelerator chip 1820. An accelerator is a functional block that specially performs a certain function of the AP 1800 and may include a GPU that is a functional block specially performing graphics data processing, a neural processing unit (NPU) that is a functional block specially performing AI calculation and inference, and a data processing unit (DPU) that is a functional block specially performing data transmission.

The system 1000 may include the DRAMs 1500a and 1500b. The AP 1800 may control the DRAMs 1500a and 1500b through commands and mode register setting, which comply with JEDEC standards, or may set a DRAM interface protocol and communicate with the DRAMs 1500a and 1500b to use a company's unique functions, such as low voltage, high speed, reliability, and a CRC function, and an ECC function. For example, the AP 1800 may communicate with the DRAM 1500a through an interface, such as LPDDR4 or LPDDR5, complying with the JEDEC standards, and the accelerator block or the accelerator chip 1820 may set a new DRAM interface protocol and communicate with the DRAM 1500b to control the DRAM 1500b, which has a higher bandwidth than the DRAM 1500a for an accelerator.

Although only the DRAMs 1500a and 1500b are illustrated in FIG. 12, embodiments are not limited thereto, and any type of memory, such as PRAM, SRAM, MRAM, RRAM, ferroelectric RAM (FRAM), or hybrid RAM, which satisfies the requirements of a bandwidth, a response speed, and/or a voltage for the AP 1800 or the accelerator chip 1820, may be used. The DRAMs 1500a and 1500b have relatively less latency and bandwidth than the I/O devices 1700a and 1700b or the flash memory devices 1600a and 1600b. The DRAMs 1500a and 1500b may be initialized when the system 1000 is powered on and may be loaded with an operating system (OS) and application data to be used as a temporary storage of the OS and the application data or may be used as a space for execution of various kinds of software code.

The four fundamental arithmetic operations, i.e., addition, subtraction, multiplication, and division, vector operations, address operation, or fast Fourier transform (FFT) operations may be performed in the DRAMs 1500a and 1500b. Functions for executions used for inference may also be performed in the DRAMs 1500a and 1500b. At this time, the inference may be performed during a deep learning algorithm using an artificial neural network. The deep learning algorithm may include a training phase, in which a model is trained using various pieces of data, and an inference phase, in which data is recognized using the trained model. In an embodiment, an image shot by a user through the camera 1100 may undergo signal processing and may be stored in the DRAM 1500*b*, and the accelerator block or the accelerator chip 1820 may perform an AI data operation using data stored in the DRAM 1500*b* and a function used for inference to recognize the data.

The system 1000 may include a plurality of storages or the flash memory devices 1600*a* and 1600*b*, which have a larger capacity than the DRAMs 1500*a* and 1500*b*. The accelerator block or the accelerator chip 1820 may perform a training phase and an AI data operation using the flash memory devices 1600*a* and 1600*b*. In an embodiment, the flash memory devices 1600*a* and 1600*b* may include a memory controller 1610 and a flash memory 1620. The flash memory devices 1600*a* and 1600*b* may allow the AP 1800 and/or the accelerator chip 1820 to efficiently perform a training phase and an inference AI data operation using an arithmetic unit included in the memory controller 1610. The flash memory devices 1600*a* and 1600*b* may store images shot through the camera 1100 or data received from a data network. For example, the flash memory devices 1600*a* and 1600*b* may store augmented and/or virtual reality contents, high definition (HD) contents, or ultra-high definition (UHD) contents.

When the system 1000 performs ZQ calibration between elements thereof, the system 1000 may perform calibration without hardware components, such as a ZQ pin and an external resistor connected to the ZQ pin. A first device, e.g., the controller 1810 of the AP 1800, may not include a ZQ pin and an external resistor connected to the ZQ pin and may store output driver impedance parameters, which are related to pull-up output voltage (or VOH) conditions of a first signal pin connected to a second device (e.g., the DRAM 1500*a* or 1500*b* or the flash memory device 1600*a* or 1600*b*), in an RCW and perform ZQ calibration using a VOH target level of the first signal pin to control the termination resistance of the first signal pin. The second device (e.g., the DRAM 1500*a* or 1500*b* or the flash memory device 1600*a* or 1600*b* may include a ZQ pin and an external resistor connected to the ZQ pin and perform ZQ calibration using the external resistor, which is connected to the ZQ pin, to control the termination resistance of a second signal pin corresponding to the first signal pin.

Depending on the embodiment, the output driver impedance parameter of a first device has a first configuration, the receiver ODT parameter of a second device has a second configuration, and the first configuration and the second configuration may be the same. Depending on the embodiment, the configurations may be referred to with various identifiers, for example, a third configuration, a fourth configuration, a fifth configuration, a sixth configuration, a seventh configuration, an eighth configuration, a ninth configuration, a tenth configuration, an eleventh configuration, a twelfth configuration, a thirteenth configuration, a fourteenth configuration, a fifteenth configuration and a sixteenth configuration.

FIG. 13 illustrates pin 240, Node A, channel 130, pin 740 and pin 750, according to an embodiment. As described above, voltage control of pins of first device 110 (using for example CODE1 and CODE2) may be determined using pin 240 and Node A (a node internal to first device 110) and without configuring first 110 with an external calibration resistor. Voltages for pins of second device 120 (using for example CODE3 and CODE4), connected to channel 130, may be configured using a calibration resistor connected to pin 750.

While embodiments have been particularly shown and described, it will be understood that various changes in form and details may be made therein without departing from the spirit and scope of the following claims.

What is claimed is:

1. A device comprising:
   an output driver circuit connected to a signal pin, the output driver circuit interfacing with an external device over a channel via the signal pin;
   a register control word (RCW) configured to store an output driver impedance parameter related to a pull-up output voltage (VOH) condition of the signal pin; and
   an impedance control (ZQ) calibration circuit connected to the signal pin and configured to perform calibration using a VOH target level of the signal pin and control an output driver impedance at the signal pin connected to the channel.

2. The device of claim 1, wherein the device does not include a ZQ pin connected to an external resistor.

3. The device of claim 1, wherein the RCW is further configured to store a receiver on-die termination (ODT) parameter of the external device corresponding to the signal pin, and
   the output driver impedance parameter of the device comprises a first configuration and the receiver ODT parameter of the external device comprises a second configuration, and
   the first configuration and the second configuration are same.

4. The device of claim 1, wherein the VOH target level is set to half of a power supply voltage level of the device.

5. The device of claim 1, wherein the output driver circuit comprises:
   a pull-up driver circuit comprising a plurality of P-channel metal-oxide semiconductor (PMOS) transistors connected to a power supply voltage line and to a signal node connected to the signal pin; and
   a pull-down driver circuit comprising a plurality of N-channel MOS (NMOS) transistors connected to the signal node and to a ground voltage line.

6. The device of claim 5, wherein the ZQ calibration circuit comprises:
   a pull-up replica circuit comprising a third configuration, the pull-up driver circuit comprising a fourth configuration, and the third configuration and the fourth configuration being same,
   the pull-up replica circuit being connected to the signal node and configured to perform pull-up calibration by a first code; and
   a pull-down replica circuit comprising a fifth configuration, the pull-down driver circuit comprising a sixth configuration, the fifth configuration and the sixth configuration being same, and the pull-down replica circuit being connected to the pull-up replica circuit and configured to perform pull-down calibration by a second code,
   wherein the first code is provided to the pull-up driver circuit, and the second code is provided to the pull-down driver circuit.

7. The device of claim 6, wherein the device is configured as a memory controller, and the external device is configured as a memory device.

8. An apparatus comprising:
   a memory device; and
   a memory controller configured to control the memory device,
   wherein the memory controller comprises:

a first output driver circuit connected to a first signal pin, the first output driver circuit interfacing with the memory device over a channel via the first signal pin;

a register control word (RCW) configured to store an output driver impedance parameter related to a pull-up output voltage (VOH) condition of the first signal pin; and a first impedance control (ZQ) calibration circuit connected to the first signal pin and configured to perform calibration using a VOH target level of the first signal pin and control a first output driver impedance at the first signal pin connected to the channel.

9. The apparatus of claim 8, wherein the memory controller does not include a ZQ pin connected to an external resistor.

10. The apparatus of claim 8, wherein the RCW is further configured to store a receiver on-die termination (ODT) parameter of the memory device corresponding to the first signal pin, and the output driver impedance parameter of the memory controller has a same configuration as the receiver ODT parameter of the memory device.

11. The apparatus of claim 8, wherein the VOH target level is set to half of a power supply voltage level of the memory controller and the memory device.

12. The apparatus of claim 8, wherein the first output driver circuit comprises:

a first pull-up driver circuit comprising a plurality of P-channel metal-oxide semiconductor (PMOS) transistors connected to a power supply voltage line and a first signal node connected to the first signal pin; and a first pull-down driver circuit comprising a plurality of N-channel MOS (NMOS) transistors connected to the first signal node and to a ground voltage line.

13. The apparatus of claim 12, wherein the first ZQ calibration circuit comprises:

a first pull-up replica circuit comprising a seventh configuration, the first pull-up driver circuit comprising an eighth configuration, the seventh configuration and the eighth configuration being same, and the first pull-up replica circuit being connected to the first signal node and configured to perform pull-up calibration by a first code; and a first pull-down replica circuit comprising a ninth configuration, the first pull-down driver circuit comprising a tenth configuration, the ninth configuration and the tenth configuration being same, and the first pull-down replica circuit being connected to the first pull-up replica circuit and configured to perform pull-down calibration by a second code, and the first code provided to the first pull-up driver circuit, and the second code provided to the first pull-down driver circuit.

14. The apparatus of claim 8, wherein the memory device comprises:

a second signal pin corresponding to the first signal pin;

a second output driver circuit connected to the second signal pin;

a ZQ pin connected to an external resistor; and a second ZQ calibration circuit connected to the ZQ pin and configured to perform calibration using the external resistor and control a second output driver impedance at the second signal pin connected to the channel.

15. The apparatus of claim 14, wherein the second output driver circuit comprises:

a second pull-up driver circuit comprising a plurality of P-channel metal-oxide semiconductor (PMOS) transistors connected to a power supply voltage line and a second signal node connected to the second signal pin; and a second pull-down driver circuit comprising a plurality of N-channel MOS (NMOS) transistors connected to the second signal node and to a ground voltage line.

16. The apparatus of claim 15, wherein the second ZQ calibration circuit comprises:

a second pull-up replica circuit comprising an eleventh configuration, the second pull-up driver circuit comprising a twelfth configuration, the eleventh configuration and the twelfth configuration being same, and the second pull-up replica circuit being connected to a ZQ node connected to the ZQ pin and configured to perform pull-up calibration by a third code; and a second pull-down replica circuit comprising a thirteenth configuration, the second pull-down driver circuit comprising a fourteenth configuration, the thirteenth configuration and the fourteenth configuration being same, and the second pull-down replica circuit being connected to the second pull-up replica circuit and configured to perform pull-down calibration by a fourth code, and the third code is provided to the second pull-up driver circuit, and the fourth code is provided to the second pull-down driver circuit.

17. A method of calibrating impedance control (ZQ) between a first device and a second device interfacing with the first device over a channel, the method comprising:

storing, by the first device, an output driver impedance parameter in a register control word (RCW), the output driver impedance parameter being related to a pull-up output voltage (VOH) condition of a first signal pin connected to the second device; and performing, by the first device, ZQ calibration using a VOH target level of the first signal pin, wherein a first output driver impedance at the first signal pin connected to the channel is controlled.

18. The method of claim 17, further comprising storing a receiver on-die termination (ODT) parameter of the second device in the RCW, the second device corresponding to the first signal pin, wherein the output driver impedance parameter of the first device comprises a fifteenth configuration, the receiver ODT parameter of the second device has a sixteenth configuration, and the fifteenth configuration and the sixteenth configuration are same.

19. The method of claim 17, wherein the VOH target level is set to half of a power supply voltage level of the first device and the second device.

20. The method of claim 17, further comprising performing, by the second device, ZQ calibration using an external resistor connected to a ZQ pin, wherein a second output driver impedance at a second signal pin connected to the channel of the second device is controlled, the second signal pin of the second device corresponding to the first signal pin of the first device.

* * * * *